United States Patent

Anai

[11] Patent Number: 6,079,428
[45] Date of Patent: Jun. 27, 2000

[54] APPARATUS FOR REMOVING COATED FILM FROM PERIPHERAL PORTION OF SUBSTRATE

[75] Inventor: Noriyuki Anai, Koshimachi, Japan

[73] Assignee: Tokyo Electron Limited, Tokyo, Japan

[21] Appl. No.: 09/126,276

[22] Filed: Jul. 30, 1998

[30] Foreign Application Priority Data

Aug. 1, 1997 [JP] Japan .................................. 9-220921

[51] Int. Cl.$^7$ ........................................ B08B 3/00
[52] U.S. Cl. .................. 134/172; 134/144; 134/902; 156/345
[58] Field of Search .................. 134/144, 172, 134/902; 156/345

[56] References Cited

U.S. PATENT DOCUMENTS

| | | | |
|---|---|---|---|
| 5,718,763 | 2/1998 | Tateyama et al. | 118/52 |
| 5,853,803 | 12/1998 | Tateyama et al. | 427/240 |
| 5,993,552 | 11/1999 | Tsukamoto et al. | 134/144 |

FOREIGN PATENT DOCUMENTS

| | | |
|---|---|---|
| 7-297121 | 11/1995 | Japan . |
| 8-131971 | 5/1996 | Japan . |

*Primary Examiner*—Thi Dang
*Attorney, Agent, or Firm*—Oblon, Spivak, McClelland, Maier & Neustadt, P.C.

[57] ABSTRACT

Disclosed is an apparatus for removing a coated film from a peripheral portion of a substrate, comprising a section for holding a rectangular substrate horizontal, a surrounding member for surrounding a peripheral portion of the substrate held by the holding section, a discharge section mounted to face an upper peripheral portion of the substrate held by the holding section, rotatable about its longitudinal axis, a supply mechanism for supplying a solvent capable of dissolving the coated film into the solvent discharge section, a discharge rate controller for controlling the discharge rate of the solvent from the discharge section, a rotating mechanism for rotating the discharge section about its longitudinal axis between a first position in which the discharge port faces perpendicularly downward the front surface of the substrate and a second position, a suction mechanism, and control means for controlling the operation of each of the controller and the rotating mechanism.

14 Claims, 12 Drawing Sheets

APPARATUS FOR REMOVING COATED FILM FROM PERIPHERAL PORTION OF SUBSTRATE

BACKGROUND OF THE INVENTION

The present invention relates to an apparatus for removing a coated film from a peripheral portion of a substrate, particularly a substrate for a liquid crystal display (LCD) device.

In general, a photolithography technology is employed in the manufacture of an LCD device for forming an electrode pattern of an indium tin oxide (ITO) thin film on a glass substrate. In the photo-lithography technology, a photoresist solution is dripped onto an LCD substrate which is kept rotated by a spin chuck so as to form a photoresist film of a uniform thickness over the entire surface of the substrate, followed by exposing the photoresist film to light in a predetermined pattern and subsequently developing the patterned film.

If the LCD substrate the rotation of which is stopped after formation of the photoresist film is. left to stand, the resist film in a peripheral portion of the substrate is rendered thicker than that in a central portion of the substrate. The non-uniformity of the film thickness is considered to be caused by a surface tension acting on the soft resist film containing a solvent. It should also be noted that, in the coating step, the resist solution flows into a peripheral portion on a back surface of the substrate, with the result that resist which is not required for forming a circuit pattern is attached to the substrate. It is impossible to eliminate completely the non-uniformity of the resist film thickness or to remove completely the undesired resist coating from the peripheral portion of the substrate in the developing step. Therefore, the resist partly remains in the peripheral portion of the substrate after the developing step. When the remaining resist is dried, the dry resist peels off the substrate so as to generate particles.

A measure for avoiding the particle generation is proposed in, for example, Japanese Patent Disclosure (Kokai) No. 8-131971. Disclosed in this prior art is an apparatus for removing the resist coating from a peripheral portion of a substrate immediately after the resist coating step. The apparatus comprises a solvent discharge section having a length substantially equal to one side of an LCD substrate and positioned to face the substrate such that a solvent is discharged to cover the entire peripheral portion on one side of the substrate. While the solvent discharge section, from which a solvent is being discharged toward the substrate, is horizontally moved along the substrate from an inner region toward an outer region of the substrate, the dissolved resist is removed by suction through a suction discharge passageway. It is also taught that the dissolved resist is removed by suction through a suction discharge passageway while the solvent discharge section, through which a solvent is being discharged, is gradually inclined toward a peripheral portion of the substrate.

In this prior art, however, the dissolved resist tends to be deposited and accumulated in the vicinity of a peripheral edge of the substrate so as to remain there. This tendency is strong particularly in a large LCD substrate, making it impossible to remove completely the resist coating from the peripheral edge of the substrate. It should be noted that, in the case of using a solvent discharge section large enough to cover entirely one side of the LCD substrate, it is impossible to remove completely the materials dissolved in the solvent from the LCD substrate unless the apparatus is equipped with a suction discharge mechanism of a markedly large capacity. However, if the apparatus is equipped with a large pump having a large suction discharge capacity in order to remove completely the dissolved resist, both the facility cost and the running cost are prominently increased.

BRIEF SUMMARY OF THE INVENTION

An object of the present invention is to provide an apparatus for removing a coated film from a peripheral edge of a substrate, which permits efficiently removing the coated film from a peripheral edge of a substrate with a small suction discharge capacity.

According to an aspect of the present invention, there is provided an apparatus for removing a coated film from a peripheral portion of a substrate, comprising:

a substrate holding section for holding a rectangular substrate substantially horizontal such that a film-coated surface of the substrate faces upward;

a surrounding member for surrounding a peripheral portion of the substrate held by the substrate holding section;

a solvent discharge section mounted to face an upper peripheral portion of the substrate held by the substrate holding section, rotatable about its longitudinal axis, and having a solvent discharge port substantially equal in length to one side of the rectangular substrate;

a solvent supply mechanism for supplying a solvent capable of dissolving the coated film into the solvent discharge section;

a solvent discharge rate control mechanism for controlling the discharge rate of the solvent from the solvent discharge section;

a rotating mechanism for rotating the solvent discharge section about its longitudinal axis between a first position in which the solvent discharge port faces perpendicularly downward the front surface of the substrate and a second position in which the solvent discharge port obliquely faces a peripheral portion on the front surface of the substrate;

a suction discharge mechanism including a suction discharge passageway for discharging by suction the coated film dissolved in the solvent and the solvent itself; and control means for controlling the operation of each of the solvent discharge rate control mechanism and the rotating mechanism;

wherein the control means controls the rotating mechanism, while allowing the solvent to be discharged from the solvent discharge port, to be rotated from the first position to the second position and also controls the solvent discharge rate control mechanism to permit the solvent to be discharged from the solvent discharge port in a larger amount when the solvent discharge port is in the second position than in the first position.

In the present invention, it is desirable for a rod having a slit, which communicates with the solvent discharge port, formed therein is rotatably arranged within the casing. It is also desirable for the slit to be longer than the longer side of the rectangular substrate.

Also, a hole having at least a small width portion and a large width portion is formed in the casing. When the rod is rotated within the casing to permit the solvent discharge port to be in a first position at which the solvent discharge port faces perpendicularly downward, the slit formed in the rod communicates with the small width portion of the hole so as to diminish the solvent discharge rate from the solvent discharge port. When the rod is further rotated within the casing to permit the solvent discharge port to be in a second position at which the solvent discharge port obliquely faces the substrate, the slit formed in the rod communicates with the large width portion of the hole made in the casing so as to increase the solvent discharge rate from the solvent discharge port.

The apparatus of the present invention further comprises a moving mechanism for moving the solvent discharge section along the front surface of the substrate in a direction perpendicular to the longitudinal direction of the solvent discharge section.

In the apparatus of the present invention, the control means controls the moving mechanism, while the solvent discharge port is being rotated by the rotating mechanism from the first position to the second position, to permit the solvent discharge section to be moved along the front surface of the substrate in a direction perpendicular to the longitudinal direction of the solvent discharge section.

Further in the apparatus of the present invention, the solvent supply mechanism includes pressurizing means for supplying a pressurized gas into the liquid reservoir of the header.

Still further, in the apparatus of the present invention, the suction discharge port is formed in the surrounding member.

It is desirable for the apparatus of the present invention to further comprise a header equipped with a liquid reservoir into which a solvent is supplied from the solvent supply mechanism. The header is arranged above the solvent discharge section, and the liquid reservoir communicates with the solvent discharge port of the solvent discharge section.

It is also desirable for the apparatus to further comprise a moving mechanism for moving the suction discharge mechanism to permit the suction discharge port to be moved toward or away from a peripheral portion of the substrate.

It is also desirable for the apparatus of the present invention to comprise a second solvent discharge section for spraying a solvent against a peripheral portion on the back surface of the substrate.

It is also desirable for the apparatus of the present invention to comprise a second suction discharge means for sucking and discharging the material dissolved in the solvent and removed from a peripheral portion on the back surface of the substrate.

It should be noted that the slit formed in the rod included in the solvent discharge section extends through the rod in the radial direction of the rod such that the slit communicates at one end with the liquid reservoir and at the other end with the free space within the surrounding member.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

Let us describe various preferred embodiments of the present invention with reference to the accompanying drawings.

Figure 1:
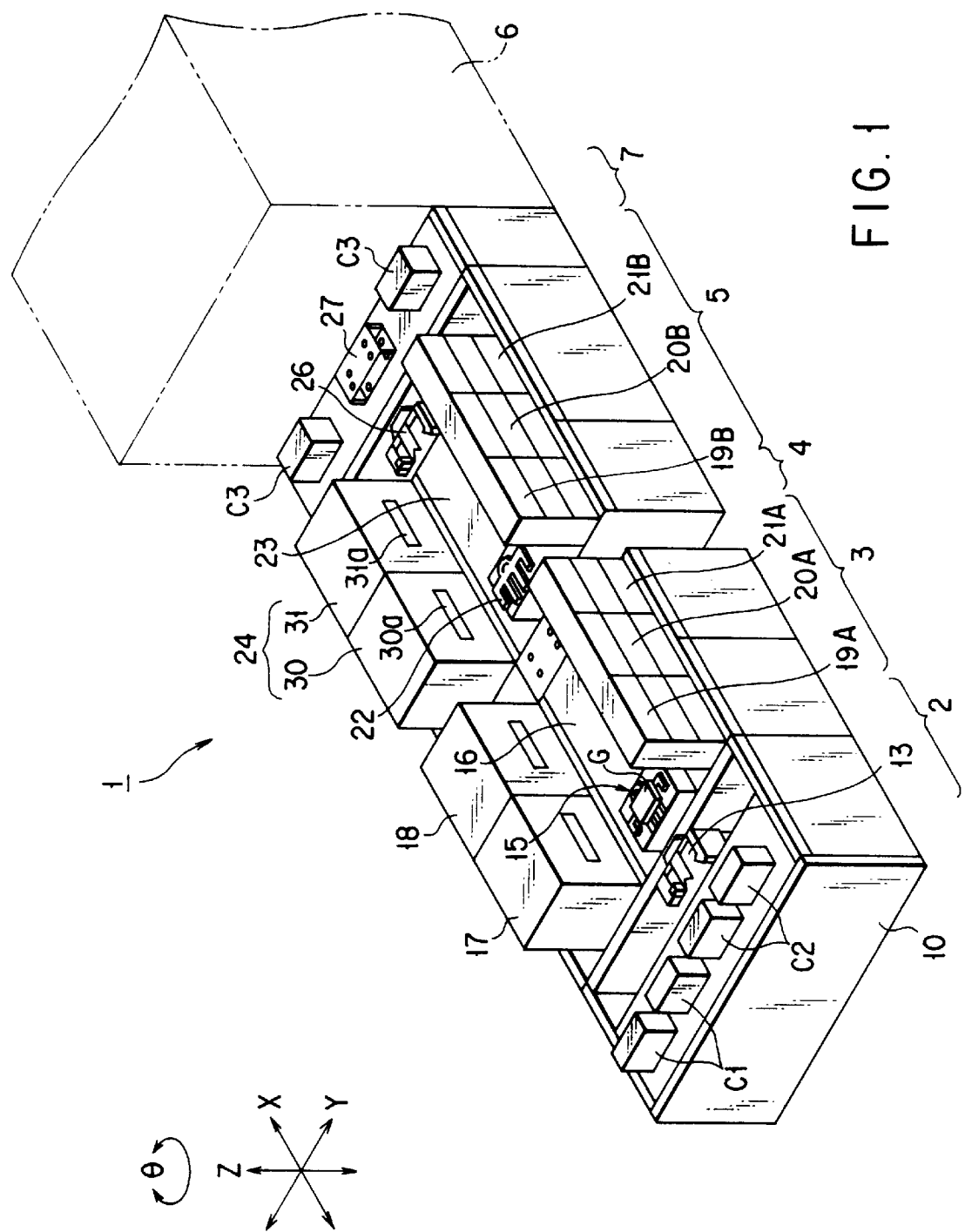
FIG. 1 is an oblique view schematically showing the construction of a substrate processing system.

As shown in FIG. 1, an LCD substrate processing apparatus 1 comprises a cassette section 2, a first process section 3, a second process section 5, a first interface section 4, and a second interface section 7. Further, the apparatus 1 is connected to a light exposure apparatus 6 via the second interface section 7. A cassette table 10 and a first sub-arm mechanism 13 are arranged in the cassette section 2. Four cassettes C1, C2 are disposed on the cassette table 10 so as to be arranged side by side in a Y-axis direction. Untreated LCD substrates G, i.e., substrates before treatment, are housed in the two cassettes C1. On the other hand, treated substrates G are housed in the remaining two cassettes C2. The first sub-arm mechanism 13 is equipped with a holder, a back-and-forth driving mechanism for moving the holder back and forth, a Y-axis driving mechanism for moving the holder in the Y-axis direction, a Z-axis driving mechanism for moving the holder in the Z-axis direction, and a θ-swinging mechanism for swinging the holder about the Z-axis. The untreated substrates G are taken out of the cassettes C1 by the sub-arm mechanism 13. Also, the treated substrates G are put into the cassettes C2 by the sub-arm mechanism 13.

The first process section 3 comprises a main arm mechanism 15, liquid treating units 17, 18 and thermal treating units 19A, 20A, 21A. The main arm mechanism 15, which is movable along a central path 16 of the first process section 3, is equipped with a holder, a back-and-forth driving mechanism for driving back and forth the holder, an X-axis driving mechanism for moving the holder in a direction of the X-axis, a Z-axis driving mechanism for moving the holder in a direction of the Z-axis, and a θ-swinging mechanism for swinging the holder about the Z-axis.

The liquid treating units 17 and 18 are arranged side by side on one side of the central path 16, with the thermal treating units 19A, 20A, and 21A arranged side by side on the other side of the central path 16. Each of the liquid treating units 17 and 18 is provided with a developing device for developing a resist coating film exposed to light in a predetermined pattern in a light exposure device 6. Also, each of the thermal treating units 19A, 20A and 21A comprises a plurality of compartments stacked one upon the other and housing a baking device, a cooling device and an adhesion device.

In the first interface section 4 interposed between the first process section 3 and the second process section 5, the LCD substrate 5 is delivered between the first main arm mechanism 15 and the second main arm mechanism 22. On the other hand, in the second interface section 7 interposed between the second process section 5 and the light exposure device 6, the LCD substrate is delivered between a second sub-arm mechanism 26 and a transfer mechanism (not shown) on the side of the light exposure device.

The second process section 5 comprises a liquid treating unit 24, thermal treating units 19B, 20B, 21B, and the second main arm mechanism 22 which is movable along a central path 23 of the second process section 5. The second main arm mechanism 22 is substantially equal in construction to the first main arm mechanism 15.

The liquid treating unit 24 is disposed on one side of the central path 23. On the other hand, the thermal treating units 19B, 20B, 21B are arranged side by side on the other side of the central path 23. The liquid treating unit 24 includes a resist coating section 30 and a peripheral resist removing section 31. The substrate G is loaded by the second main arm mechanism 22 into the resist coating section 30 through an inlet port 30a. A resist coating treatment is applied to the substrate G within the resist coating section 30 and, then, transferred from the resist coating section 30 into the peripheral resist removing section 31 for removal of the peripheral resist. Finally, the substrate G is unloaded by the second main arm mechanism 22 from the peripheral resist removing section 31 through an outlet port 31a. It should be noted that the thermal treating units 19B, 20B, 21B are substantially equal to the thermal treating units 19A, 20A, 20B included in the first process section 3.

The second interface section 7 includes the second sub-arm mechanism 26, a delivery table 27 and a plurality of buffer cassettes C3. The second sub-arm mechanism 26 is substantially equal in construction to the first sub-arm mechanism 13. The delivery table 27 is equipped with a plurality of vertically movable pins for supporting the substrate G. The substrate G is delivered between the transfer mechanism (not shown) on the side of the light exposure device 6 and the second sub-arm mechanism 26 via the delivery table 27. When the light exposure device 6 is incapable of newly receiving the substrate G, the substrate G is temporarily stored in the buffer cassette C3.

Figure 2:
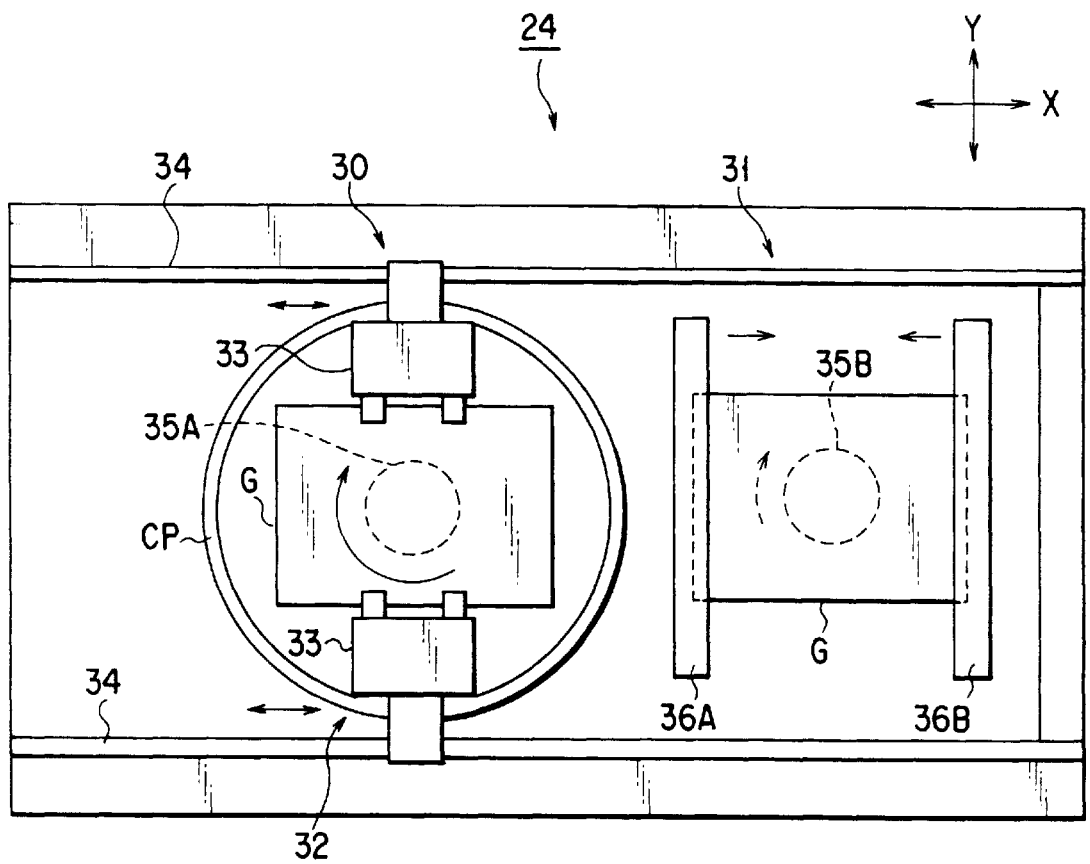
FIG. 2 is a plan view schematically showing the construction of a resist coating-peripheral coating removing unit.

The resist coating/peripheral resist removing unit 24 is shown in detail in FIG. 2. As described previously, the unit 24 includes the resist coating section 30 and the peripheral resist removing section 31. The resist coating section 30 is equipped with a spin chuck 35A, a cup CP, and a resist nozzle (not shown). The substrate G is held by the spin chuck 35A by vacuum suction and, thus, is rotated together with the spin chuck 35A. A resist solution is applied to the substrate G during the rotation to form a resist coating film on the front surface of the substrate G. The peripheral resist removing section 31 includes a spin chuck 35G for holding the substrate G and a pair of peripheral resist removers 36a, 36B. A solvent is applied from the peripheral resist removers 36a, 36B onto the substrate G held by vacuum suction by the spin chuck 35B for removing the resist coating film from the peripheral portion of the substrate G.

The substrate G is moved by a transfer mechanism 32 from the resist coating section 30 to the peripheral resist removing section 31. As shown in the drawing, a pair of parallel guide rails 34 are arranged to extend over the entire region including both the resist coating section 30 and the peripheral resist removing section 31. A pair of chuck portions 33 of transfer mechanisms 32 are slid in a direction of an X-axis along the guide rails 34. The substrate G is held by vacuum suction by a suction pad mounted at the tip of each of the chuck portions 33.

Let us describe in detail the peripheral resist removing section 31 with reference to FIGS. 3 to 7.

Specifically, the spin chuck 35B is arranged in substantially a central portion of the peripheral resist removing section 31 so as to hold the substrate G by vacuum suction. The pair of peripheral resist removers 36A, 36B are arranged to surround the peripheral portions on mutually facing sides of the substrate G held by the spin chuck 35B and supported movable in the X-axis direction by a moving mechanism 60. A solvent is supplied from a solvent supply unit 42 into these peripheral resist removers 36A, 36B. Further, the dissolved resist is discharged by vacuum suction by a suction exhaust unit 72.

Each of the peripheral resist removers 36A, 36B, which comprises a linear header 40 slightly longer than the longer side of the substrate G and a solvent discharge section 50, extends in the Y-axis direction. The header 40 communicates with the solvent supply unit 42 via a supply pipe 41. Housed in the solvent supply unit 42 are a flow rate control valve and a supply pressure adjusting mechanism (not shown). The operation of supplying a solvent from the solvent supply unit 42 is controlled by a controller 74.

Figure 3:
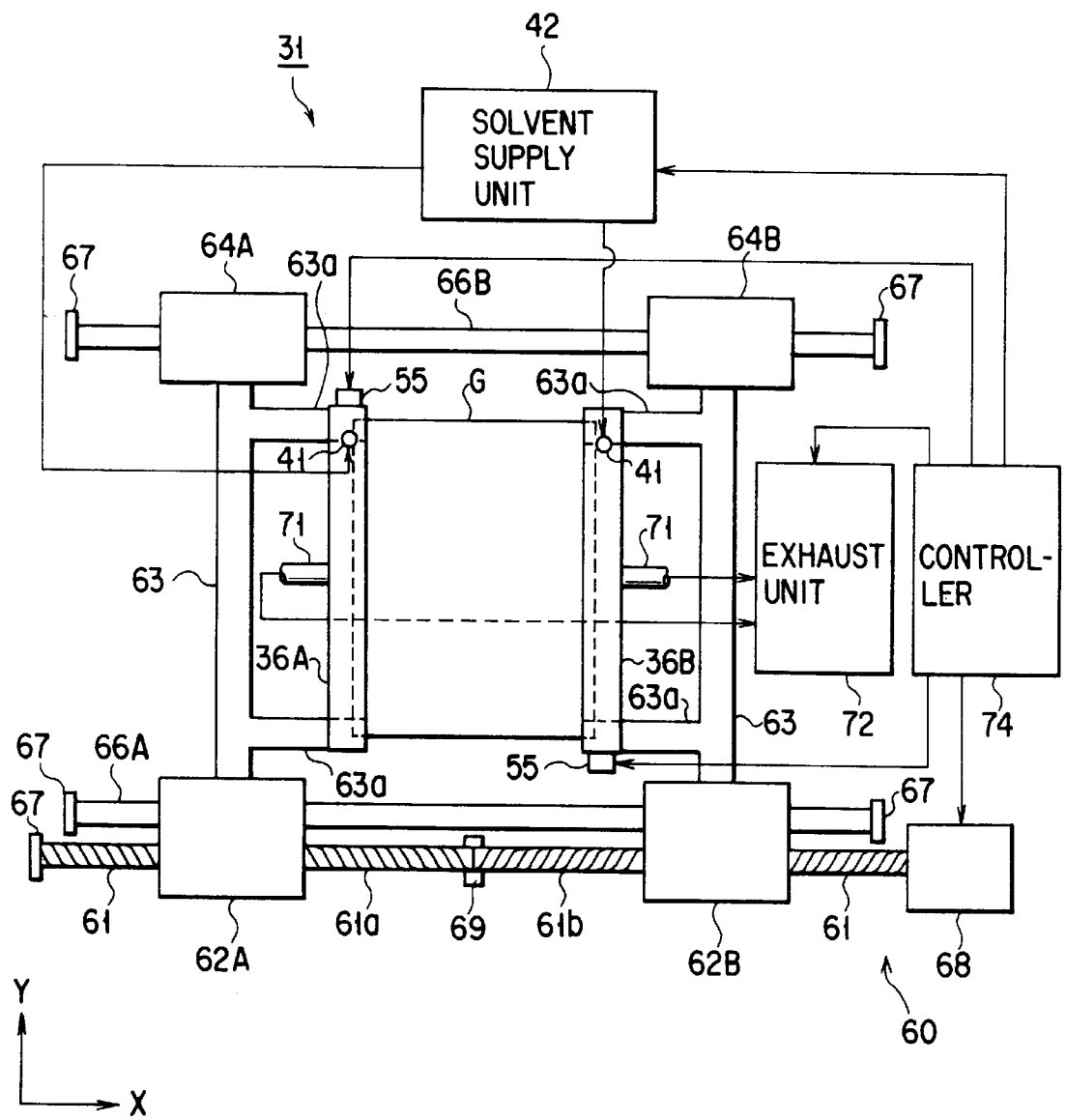
FIG. 3 is a plan view, including a block diagram, schematically showing the construction of an apparatus for removing a coated film from a peripheral portion of a substrate according to one embodiment of the present invention.

As shown in FIG. 3, the moving mechanism 60 includes a ball screw 61, sliding blocks 62A, 62B, 64A, 64B, a pair of linear guides 66A, 66B, and a stepping motor 68. The ball screw 61 extends in the X-axis direction such that one end of the ball screw 61 is joined to a rotary driving shaft of the motor 68, with the other end being joined to a stopper 67. The pair of the linear guides 66a, 66B are arranged in parallel to the ball screw 61. The first and second sliding blocks 62A, 62B are slidably mounted to the linear guide 66A. Also, the third and fourth sliding blocks 64A, 64B are slidably mounted to the other linear guide 66B. Also, each of the first and second sliding blocks 62A, 62B is engaged with the ball screw 61. Further, the first and third sliding blocks 62A, 64A are joined to each other by an arm 63. Likewise, the second and fourth sliding blocks 62B, 64B are joined to each other by another arm 63. Two sub-arms 63a are branched from each of the two arms 63. These four sub-arms 63a support the peripheral resist removers 36A and 36B.

Figure 4:
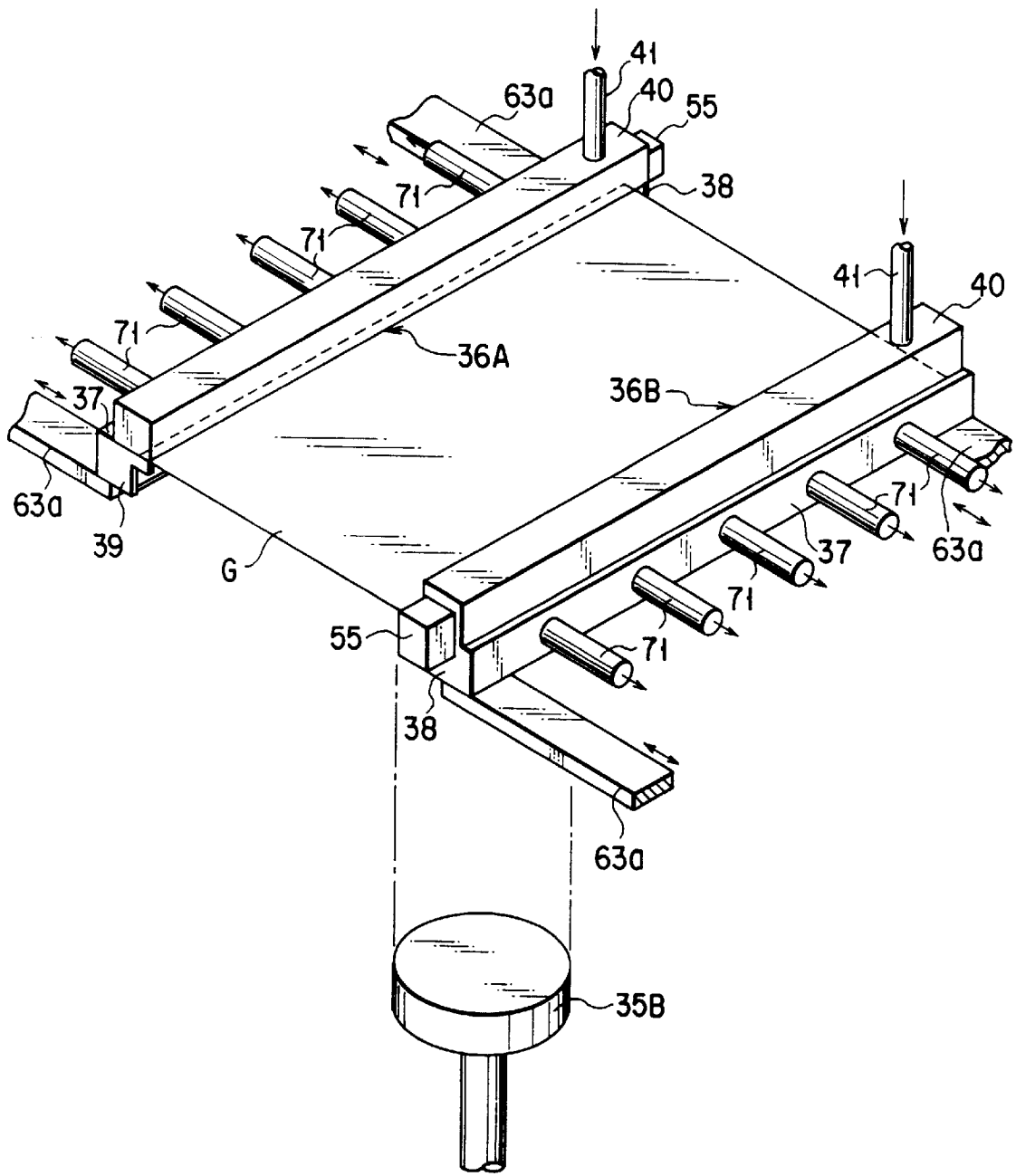
FIG. 4 is an oblique view schematically showing the construction of an apparatus for removing a coated film from a peripheral portion of a substrate according to said one embodiment of the present invention.

The ball screw 61 is supported in the central portion in the longitudinal direction by a bearing 69. The ball screw 61 consists of a left-hand thread in a section 61b ranging between the bearing 69 and the driving shaft of the motor 68, and consists of a right-hand thread in a section 61a ranging between the bearing 69 and the stopper 67. The first sliding block 62A is engaged with the ball screw 61 in the section 61a of the right-hand thread, with the second sliding block 62B being engaged with the ball screw 61 in the section 61b of the left-hand thread. It follows that, if the ball screw 61 is rotated, these first and second sliding blocks 62A and 62B are moved in opposite directions along the X-axis. The moving mechanism 60 of the particular construction permits the peripheral resist removers 36A, 36B to be aligned appropriately with the longer side or shorter side of the substrate G.

Where the peripheral resist is removed from the longer sides of the substrate G, the peripheral resist removers 36A, 36B are aligned with the longer sides of the substrate G to cover the peripheral portion of the substrate G, as shown in FIGS. 3 and 4. On the other hand, where the peripheral resist is removed from the shorter sides of the substrate G, the peripheral resist removers 36A, 36B are retreated from the substrate G, followed by rotating the substrate G by 90° by operating the spin chuck 35B so as to permit the shorter sides of the substrate G to be positioned close to the peripheral resist removers 36A, 36B. Then, the peripheral resist removers 36A, 36B are aligned with the shorter sides of the substrate G to cover the peripheral portion of the substrate G.

Figure 5:
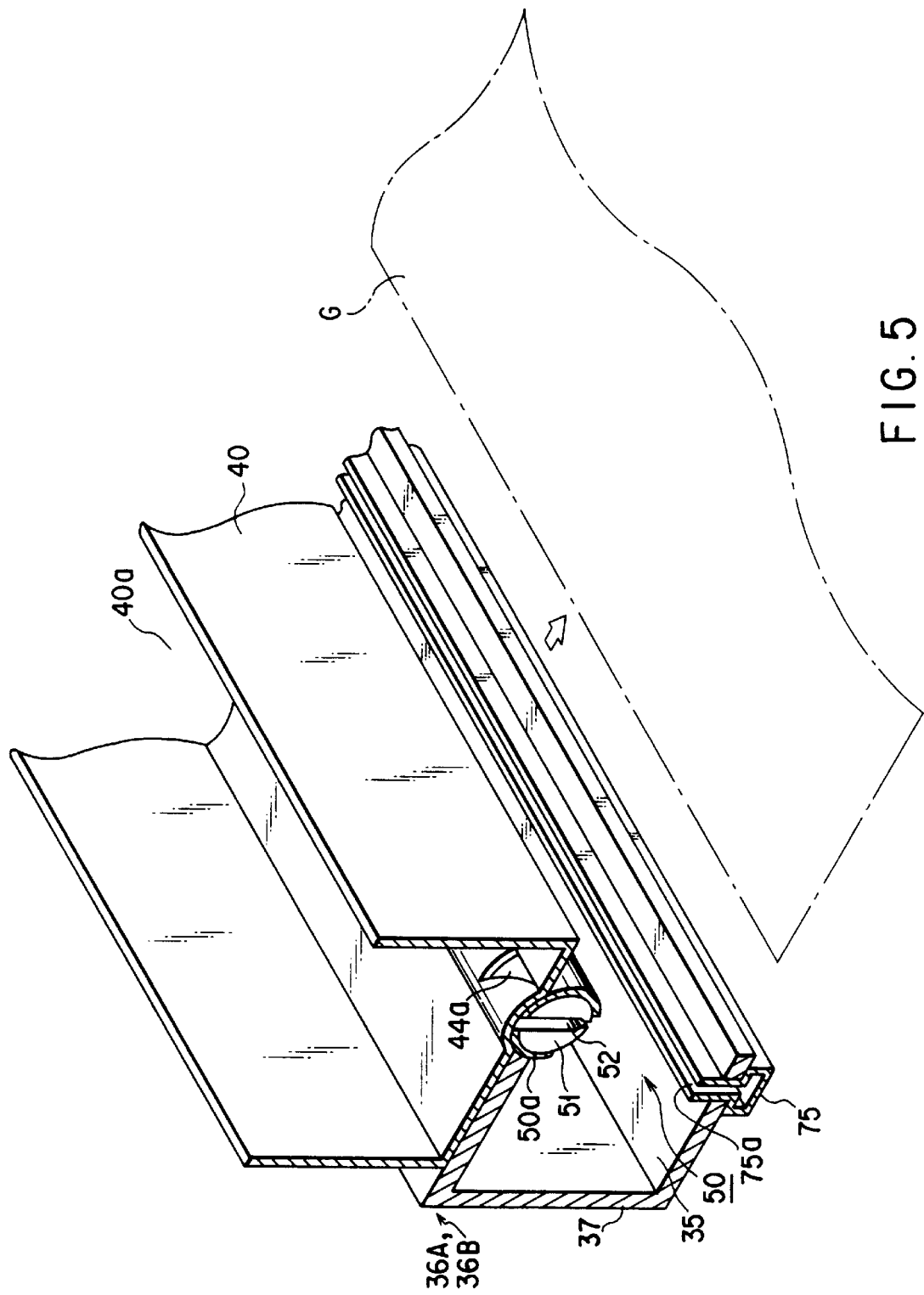
FIG. 5 is an oblique view, partly broken away, showing the gist portion of an apparatus for removing a coated film from a peripheral portion of a substrate according to said one embodiment of the present invention.

As shown in FIG. 5, the header 40 includes a liquid reservoir 40a which communicates with a slit 52 of the solvent discharge section 50 via a hole 44a. If a rod 51 is rotated within a casing 50a, the liquid reservoir 40a is allowed to communicate with the slit 52 via the hole 44a. Further, the slit 52 communicates with a free space 35 via an opening 44b so as to permit the solvent to flow through the slit 52 so as to be discharged from the discharge port 53.

Figure 6:
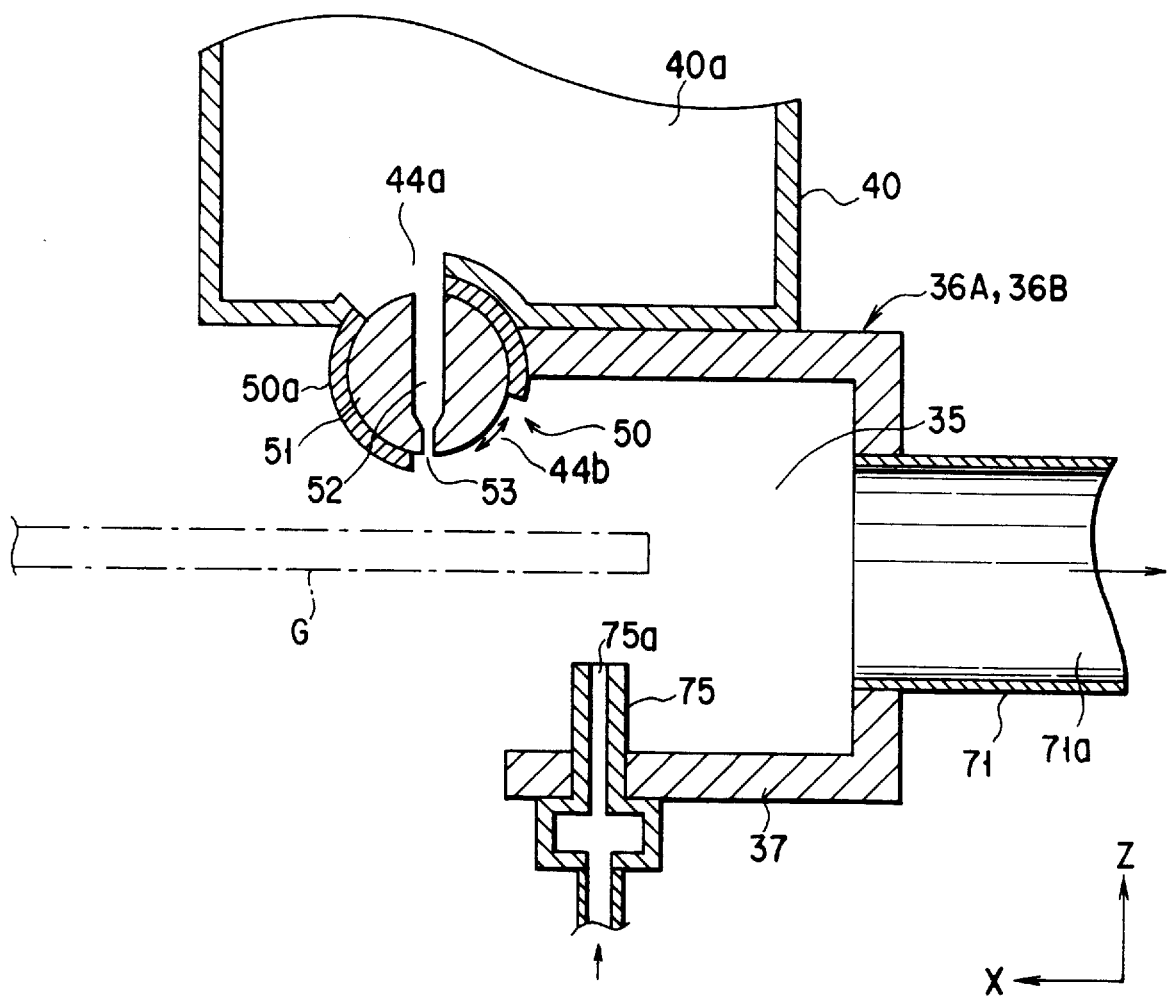
FIG. 6 is a cross sectional view showing the gist portion of an apparatus for removing a coated film from a peripheral portion of a substrate according to said one embodiment of the present invention.

As shown in FIG. 6, each of the peripheral resist removers 36A and 36B includes a surrounding member 37 having a U-shaped cross section and surrounding in a non-contact fashion a peripheral portion along one side of the substrate G. The surrounding member 37 is box-shaped and has a length large enough to house the longer side of the substrate G. As shown in FIG. 4, both ends of the surrounding member 37 are closed by edge plates 38, 39. Each of the peripheral resist removers 36A, 36B is aligned relative to the substrate G such that the longer or shorter side of the substrate G can be housed in the slender free space 35 defined by the surrounding member 37.

FIGS. 4, 5 and 6 show that the header 40 made of quartz is mounted to the upper wall of the surrounding member 37. A thinner used as a solvent is supplied through a supply pipe 41 into the liquid reservoir 40a of the header 40 so as to keep the liquid reservoir 40a filled with the thinner. The solvent discharge port 50, which is mounted to a lower portion of the header 40, extends along the lower portion of the header 40 over the entire length of the header 40.

The solvent discharge port 50 comprises the cylindrical casing 50a connected to a bottom portion of the header 40, the rod 51 housed in the cylindrical casing 50a, and a rotating mechanism 55 for rotating the rod 51 within the casing 50a. Each of the cylindrical casing 50a and the rod 51 is made of quartz.

Figure 7:
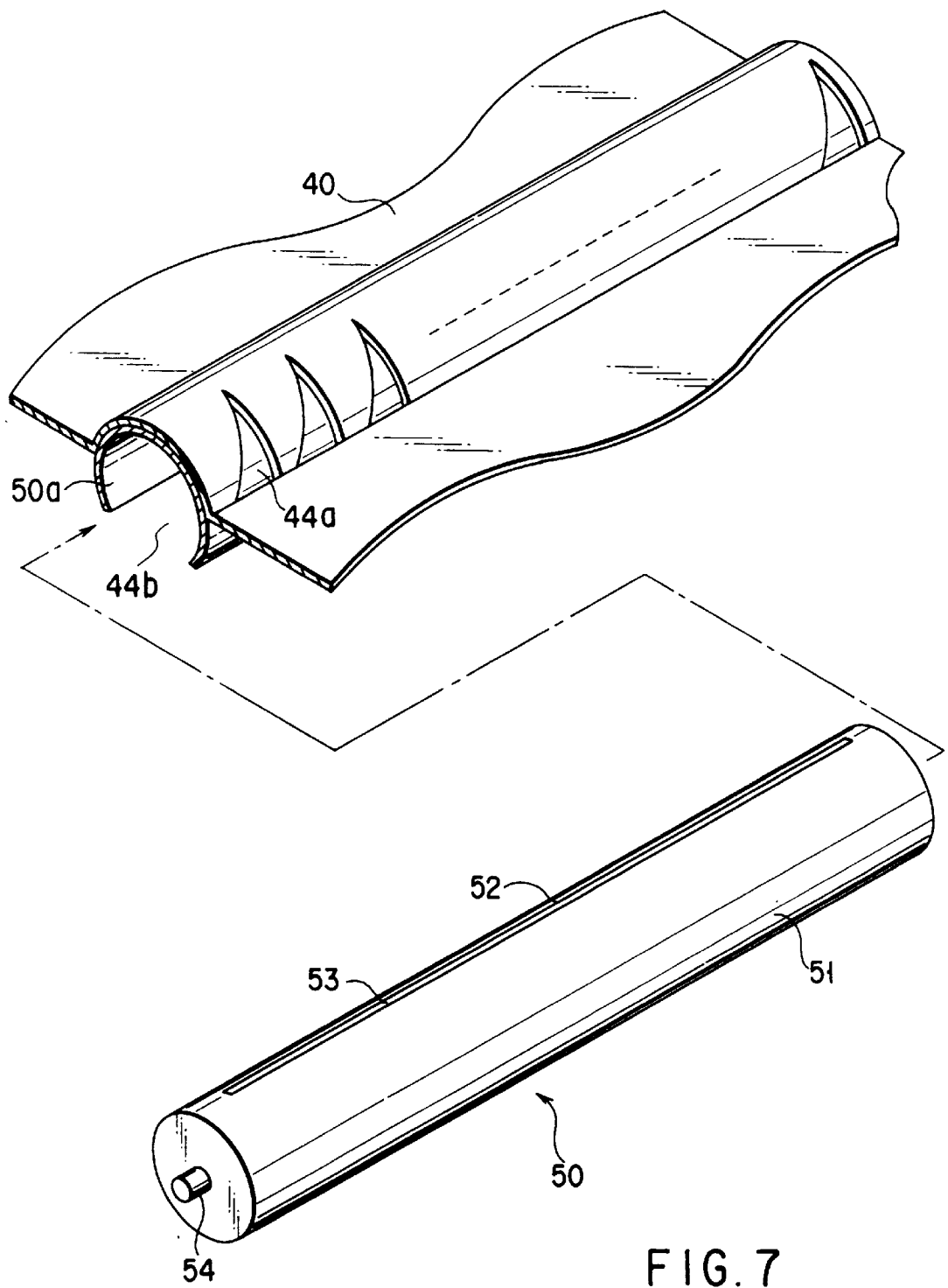
FIG. 7 is an oblique view showing in a dismantled fashion a solvent discharge portion.

As shown in FIGS. 6 and 7, a plurality of holes 44a in the form of a V-shaped recess are formed in an upper portion of the cylindrical casing 50a. Also, a slender opening 44b is formed in a lower portion of the cylindrical casing 50a. Incidentally, a part of the bottom portion of the header 40 is upwardly bent such that the outer circumferential surface of the cylindrical casing 50a fits the inner surface in the bent portion of the bottom of the header 40.

As shown in FIGS. 5 to 7, the slit 52 is formed in the rod 51. The slit 52 extends both in the longitudinal direction and radial direction of the rod 51 so as to be open at the discharge port 53.

A plurality of the holes 44a are formed through the bent portion of the bottom of the header 40 and through the wall of the cylindrical casing 50a. These holes 44a permit the liquid reservoir 40a to communicate with the slit 52. If the rod 51 is rotated, the amount of communication between the liquid reservoir 40a and the slit 52 is changed.

The hole 44a is shaped to spread downwardly from the tip of the bent portion at the bottom of the header 40 along the bent surface. It follows that, if the rod 51 is rotated from the position at which the discharge port 53 faces directly downward toward a periphery of the substrate G, that portion of the slit 52 which communicates with the hole 44a is gradually enlarged. It should be noted that the hole 44a and the slit 52 collectively form an adjusting section for adjusting the solvent flow rate discharged from within the liquid reservoir 40a. In other words, the solvent flow rate can be controlled by adjusting the rotating angle of the rod 51.

As shown in FIG. 7, supporting shafts 54 are mounted to both ends of the rod 51. One of the supporting shafts 54 is joined to the edge plate 39 acting as a bearing, with the other supporting shaft 54 being joined to a rotating mechanism 55 shown in FIG. 4, which is mounted to the edge plate 38. A small motor and a decelerating gear are housed in the rotating mechanism 55 so as to transmit the rotating force of the motor to the supporting shafts 54, thereby rotating the rod 51.

As shown in FIGS. 5 and 6, an additional solvent discharge section 75 is mounted to a lower portion of the surrounding member 37. The solvent discharge section 75 serves to spray a solvent around a periphery of the substrate G so as to remove the resist flowing toward a back surface of the substrate G so as to be attached to the peripheral portion of the substrate G. Included in the solvent discharge section 75 is a discharge port 75a extending in a longitudinal direction of the surrounding member 37 in the form of a slit.

A plurality of suction pipes 71 each having a fluid passageway 71a are mounted substantially equidistantly on the back side of the surrounding member 37. The fluid passageway 71a of the suction pipe 71 communicates with the suction port of the suction exhaust unit 72 and with the free space 35 surrounded by the surrounding member 37. Incidentally, the suction exhaust unit 72 has a substantially constant exhaust capacity. However, it is possible to make the exhaust capacity variable. Also, the opening degree of the suction exhaust pipe 71 is determined appropriately depending on the kind of the resist and the size of the substrate G.

Let us describe how to remove the resist coating film from the peripheral portions on the four sides of the LCD substrate G by using the apparatus of the construction described above with reference to FIGS. 8A to 8D.

It should be noted that the substrate G coated with resist in the resist coating section 30 is transferred to the peripheral resist removing section 31 so as to be disposed on the spin chuck 35B. In this step, the peripheral resist removers 36A, 36B are in waiting positions on both sides of the substrate G. These peripheral resist removers 36A, 36B are moved toward the substrate G which is held by vacuum suction on the spin chuck 35B so as to align the peripheral resist removers 36A, 36B with the short sides of the substrate G. Then, the free space 35 is evacuated via the fluid passageway 71a, as shown in FIG. 6. At the same time, the rod 51 is rotated so as to permit the slit 52 to communicate with the liquid reservoir 40a and the free space 35. As a result, a solvent flowing though the slit 52 is discharged from the discharge port 53 toward the substrate G.

Figure 8A:
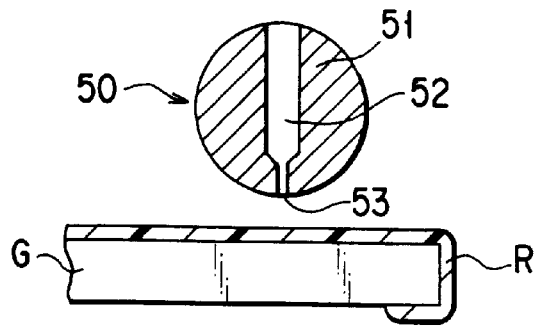
FIGS. 8A to 8D are cross sectional views schematically the steps for removing a coated film from a peripheral portion of a substrate by using the apparatus according to said one embodiment of the present invention.
Figure 8B:
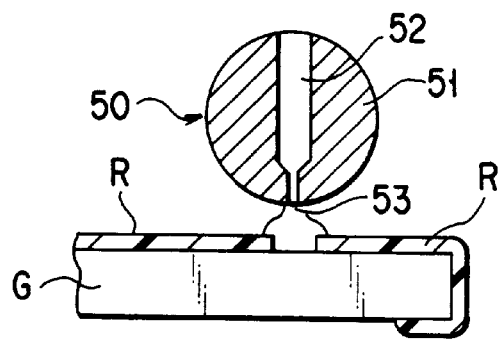

As shown in FIG. 8A, the discharge port 53 of the solvent discharge section 50 faces the upper surface of the substrate G positioned below the solvent discharge section 50 in the initial period of the treatment. In other words, the discharge port 53 is in a first position. In this step, the solvent discharged from the discharge port 53 is sprayed perpendicularly to the upper surface of the substrate G so as to dissolve that portion of the resist coating film R which is positioned somewhat inward from the edge of the substrate G, as shown in FIG. 8B. The dissolved resist and the excess solvent are scattered in the free space 35 and discharged to the suction exhaust unit 72 through the suction fluid passageways 71a. In this step, the solvent is also discharged from the solvent discharge section 75 positioned below the substrate G toward the back surface of the substrate G so as to remove the resist attached to the back surface of the substrate G. When that portion of the resist coating film R which is positioned right under the discharge port 53 has been dissolved to expose the front surface of the substrate G, the solvent spraying position is gradually moved toward the periphery of the substrate G so as to scatter the dissolved resist outward of the substrate G. Incidentally, an opening/closing valve (not shown) is mounted to a piping which permits the header 40 and the solvent supply device 42 to communicate with each other so as to start or stop the solvent spraying against the substrate G.

Figure 8C:
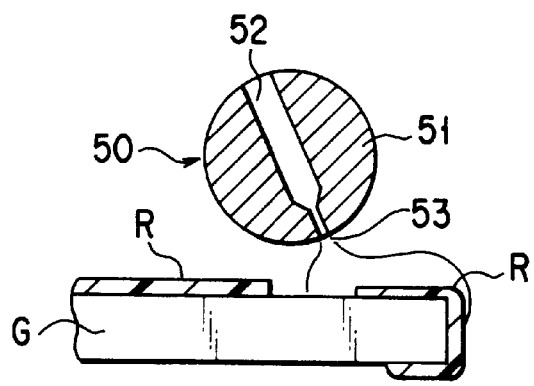

As shown in FIG. 8C, the rod 51 is gradually rotated to permit the slit 52 to be inclined gradually during the solvent spraying operation such that the discharge port 53 is turned gradually to face the edge of the substrate G. In other words, the discharge port 53 is moved gradually from the first position referred to previously to a second position at which the discharge port 53 faces the edge of the substrate G. As a result, the solvent is blown from a peripheral portion of the substrate G to the outside of the periphery of the substrate G. Also, the dissolved resist is blown to the outside of the substrate G. The transferring force of the dissolved resist depends mainly on the solvent blowing force of the solvent discharge section 50 and the sucking force of the suction pipe 71.

If the peripheral resist removers 36A, 36B are moved toward the edge of the substrate G by the moving mechanism 60 while the discharge port 53 is being turned from the first position to the second position, the resist coating film R can be removed far more efficiently.

Figure 8D:
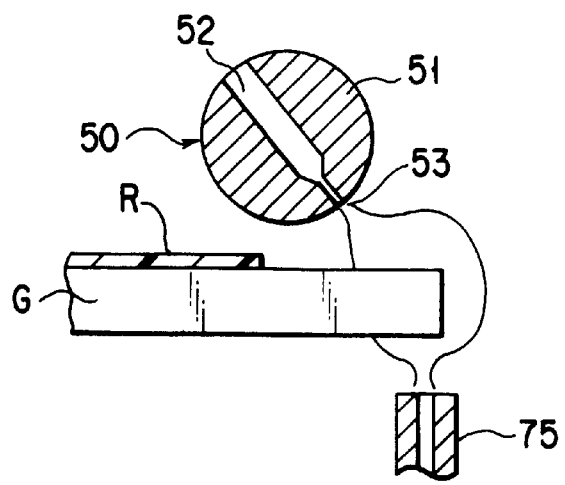

As shown in FIG. 8D, the discharge port 53 is allowed to face the edge of the substrate G at the final stage of the treatment so as to remove completely the resist coating film R from the peripheral portion of the substrate G. It should be noted that the discharge rate of the solvent from the discharge port 53 is set higher in the middle period of the treatment than in the initial period and also set higher in the final period than in the middle period. It follows that the dissolving capability of the resist coating film R is gradually increased with progress of the treatment so as to gradually increase the transferring force of the dissolved resist, with the result that the dissolved resist does not remain at all in the peripheral portion of the substrate G. Naturally, the solvent discharge rate from the solvent discharge section 50 is dependent on a cross sectional area S of the solvent passageway. The cross sectional area S, which corresponds to an area of mutual communication between the V-shaped hole 44a and the opening above the slit 52, is variable depending on the angle of rotation of the rod 51.

After removal of the peripheral resist film R from the short sides of the substrate G, the peripheral resist removers 36A, 36B are retreated by the moving mechanism 60 from the substrate G, followed by rotating the substrate G by 90° by operating the spin chuck 35B such that the long sides of the substrate G are allowed to face the peripheral resist removers 36A, 36B. Under this condition, the peripheral resist removers 36A, 36B are moved toward the long sides of the substrate G to permit the surrounding member 37 to surround the peripheral portion of the long side of the substrate G as shown in FIG. 6. Then, the peripheral resist coating film R is removed from the peripheral portion of the long side of the substrate G as in the removal of the resist coating film R from the peripheral portion of the short side of the substrate G described previously with reference to FIGS. 8A to 8D.

In the apparatus of the present invention, the solvent discharge rate is low when the discharge port 53 is in the first position, as described previously. Therefore, the resist coating film is prevented from being scattered around by a large distance and, thus, a detrimental effect is not given to the resist coating film R formed in a central portion of the substrate G.

On the other hand, the solvent discharge rate is increased when the solvent discharge port 53 is in the second position. It follows that the solvent in the vicinity of the edge of the substrate G and an upheaved portion of the dissolved resist is vigorously blown away by the solvent discharged from the discharge port 53. Also, the undesired resist coating film R on the back surface of the substrate G is dissolved in the solvent and sucked into the suction pipe 71 so as to be removed. It follows that an undesired resist coating film R alone can be selectively removed. Also, the upheaved portion of the dissolved materials can be sucked into the suction pipe 71 with a small sucking force.

It should be noted that the discharge angle of the solvent discharge section 75 on the lower side can be made variable. Also, the solvent discharge section 75 can be made swingable like the solvent discharge section 50 such that the solvent is discharged perpendicularly upward to allow the discharged solvent to be sprayed against the back surface of the substrate G disposed above the solvent discharge section 75 in the initial stage of the operation and, then, the solvent discharge section 75 is gradually swung to permit the discharged solvent to be sprayed against the periphery of the substrate G.

Further, a plurality of slits extending in the longitudinal direction of the rod 51 can be formed apart from each other in the circumferential direction of the rod 51 in the solvent discharge section 50. In this case, the slit formed in the lower position is allowed to have the larger width, and these slits are successively engaged with the hole 44a so as to gradually increase the solvent discharge rate.

A pressurized nitrogen gas can be introduced into the liquid reservoir 40a of the header 40 for supplying the solvent from within the liquid reservoir 40a into the solvent discharge section 50. Alternatively, it is possible to use a bellows pump in the solvent supply unit 42. In this case, the solvent supply rate to the discharge section 50 can be gradually increased by controlling the pumping operation of the bellows pump.

It should also be noted that a plurality of fine holes can be used in place of the slit-like discharge ports 53 and 75a of the solvent discharge sections 50 and 75, respectively.

Figure 9:
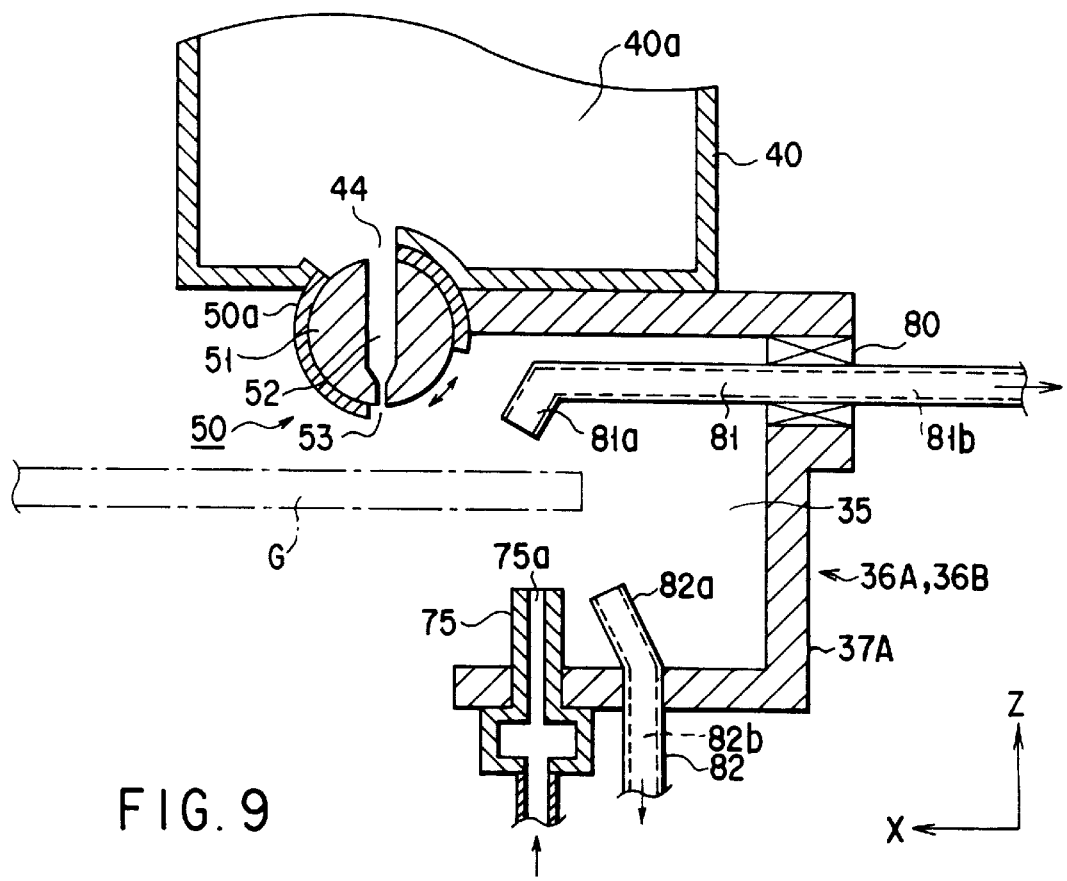
FIG. 9 is a cross sectional view showing the gist portion of an apparatus according to another embodiment of the present invention.
Figure 10:
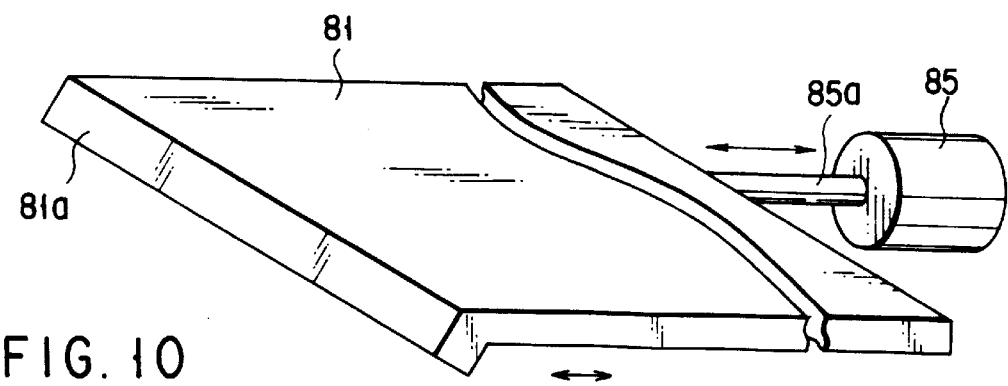
FIG. 10 is an oblique view schematically showing the construction of a suction discharge duct.

FIGS. 9 and 10 collectively show an apparatus according to another embodiment of the present invention. The peripheral resist remover included in this embodiment comprises two suction exhaust means 81, 82 differing from those included in the embodiment described previously. Specifically, as shown in FIG. 9, a first suction duct 81 extends through the vertical wall of a surrounding member 37A and a suction passageway 81b formed within the first suction duct 81 is open in the free space 35. The first suction duct 81 is supported by the surrounding member 37A via a bearing 80 and includes a tip portion 81a which is bent downward. The suction port at the tip portion 81a of the first suction duct 81 is positioned in the vicinity of the upper surface of the substrate G held by the spin chuck 35B. As shown in FIG. 10, the first duct 81 can be slid in the X-axis direction by a cylinder 85.

A second suction duct 82 is positioned below the first suction duct 81, extends downward through the bottom wall of the surrounding member 37A, and is fixed to the surrounding member 37A such that the second duct 82 is positioned adjacent to the outer surface of the lower solvent discharge section 75. As shown in the drawing, a tip portion 82a of the second suction duct 82 is bent toward the lower solvent discharge section 75.

Figure 11A:
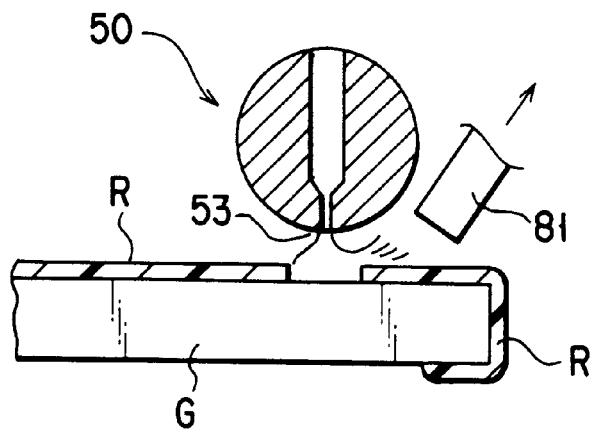
FIGS. 11A to 11C are cross sectional views schematically the steps for removing a coated film from a peripheral portion of a substrate by using the apparatus according to said another embodiment of the present invention.
Figure 11B:
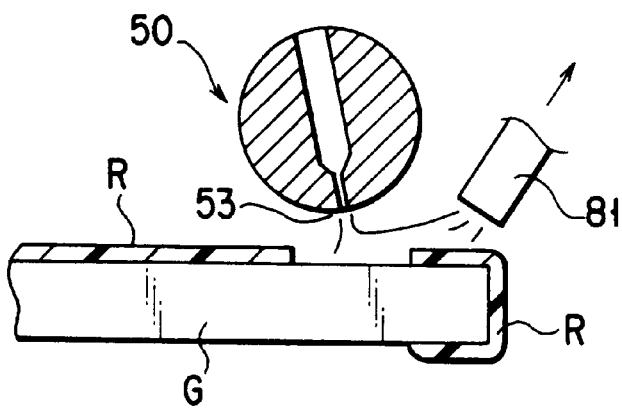
Figure 11C:
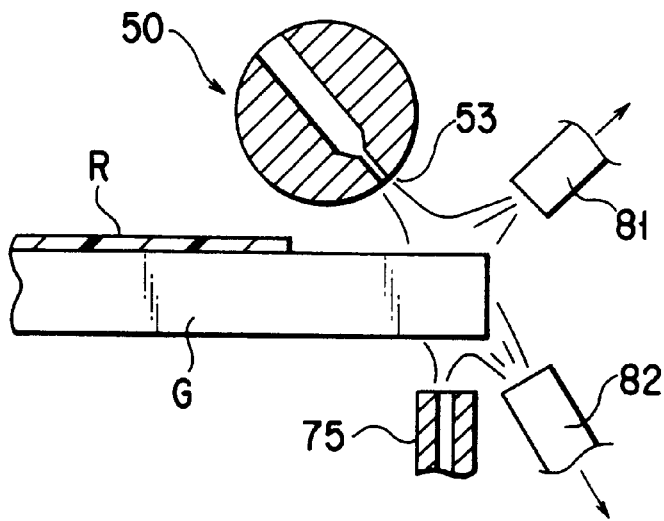

FIGS. 11A to 11C collectively show how to operate the apparatus shown in FIGS. 9 and 10. Specifically, when the discharge port 53 faces perpendicularly downward as shown in FIG. 11A, the tip portion 81a of the fist suction duct 81 is positioned close to the solvent discharge section 50 so as to suck the dissolved resist coating film R and the excess solvent present about the region right under the discharge port 53. Then, the discharge port 53 is gradually inclined and the first suction duct 81 is gradually moved toward the periphery of the substrate G, as shown in FIG. 11B. On the other hand, a solvent discharged from the lower solvent discharge section 75 is sprayed against the back surface of the substrate G so as to dissolve the resist coating film R attached to the back surface of the substrate G, as shown in FIG. 11C. In this step, the dissolved resist and the excess solvent are sucked by the second suction duct 82 for removal.

For stopping the solvent supply to the substrate G, the solvent supply to the solvent discharge section 50 is stopped first, followed by stopping the sucking operation of the first suction duct 81. Then, the solvent supply from the lower solvent discharge section 75 is stopped, followed by stopping the sucking operation of the second suction duct 82. In this case, the dissolved resist is pushed toward the periphery of the substrate G by the blowing of the solvent from the solvent discharge section 50. At the same time, the suction duct 81, which is positioned in the vicinity of front surface of the substrate G, is also moved toward the periphery of the substrate G. It follows that it is possible to prevent the dissolved resist from being accumulated to form an upheaved portion, making it possible to suck efficiently the dissolved resist. Naturally, sucking capacity can be suppressed.

Incidentally, the second suction duct 82 on the lower side can be formed integral with the second solvent discharge section 75 or can be formed movable.

Figure 12:
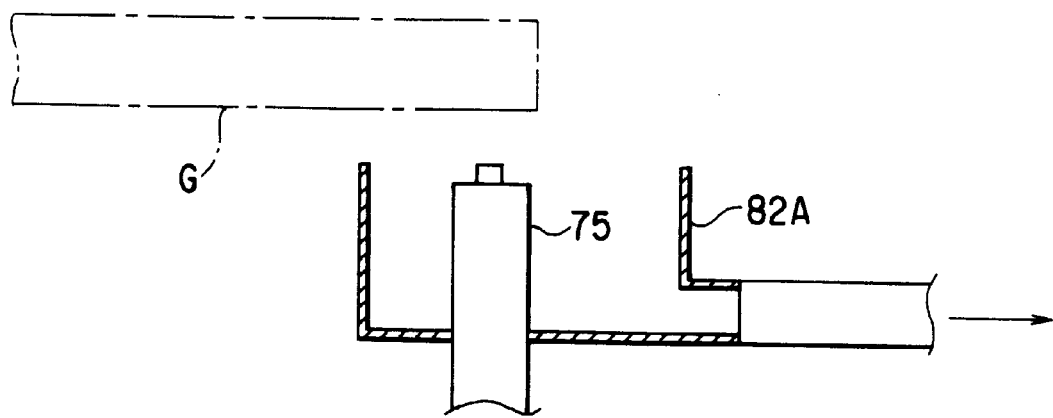
FIG. 12 is a cross sectional view schematically showing a solvent discharge section and a suction discharge duct arranged on the side of a back surface of the substrate.
Figure 13:
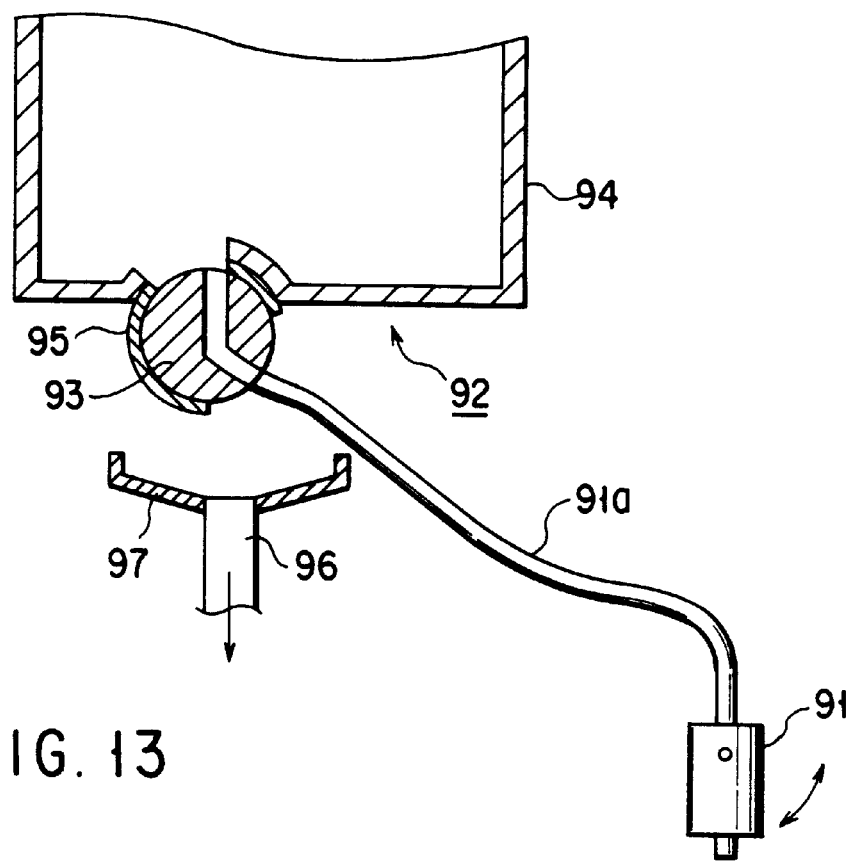
FIG. 13 is a cross sectional view schematically showing the gist portion of an apparatus according to still another embodiment of the present invention.
Figure 14:
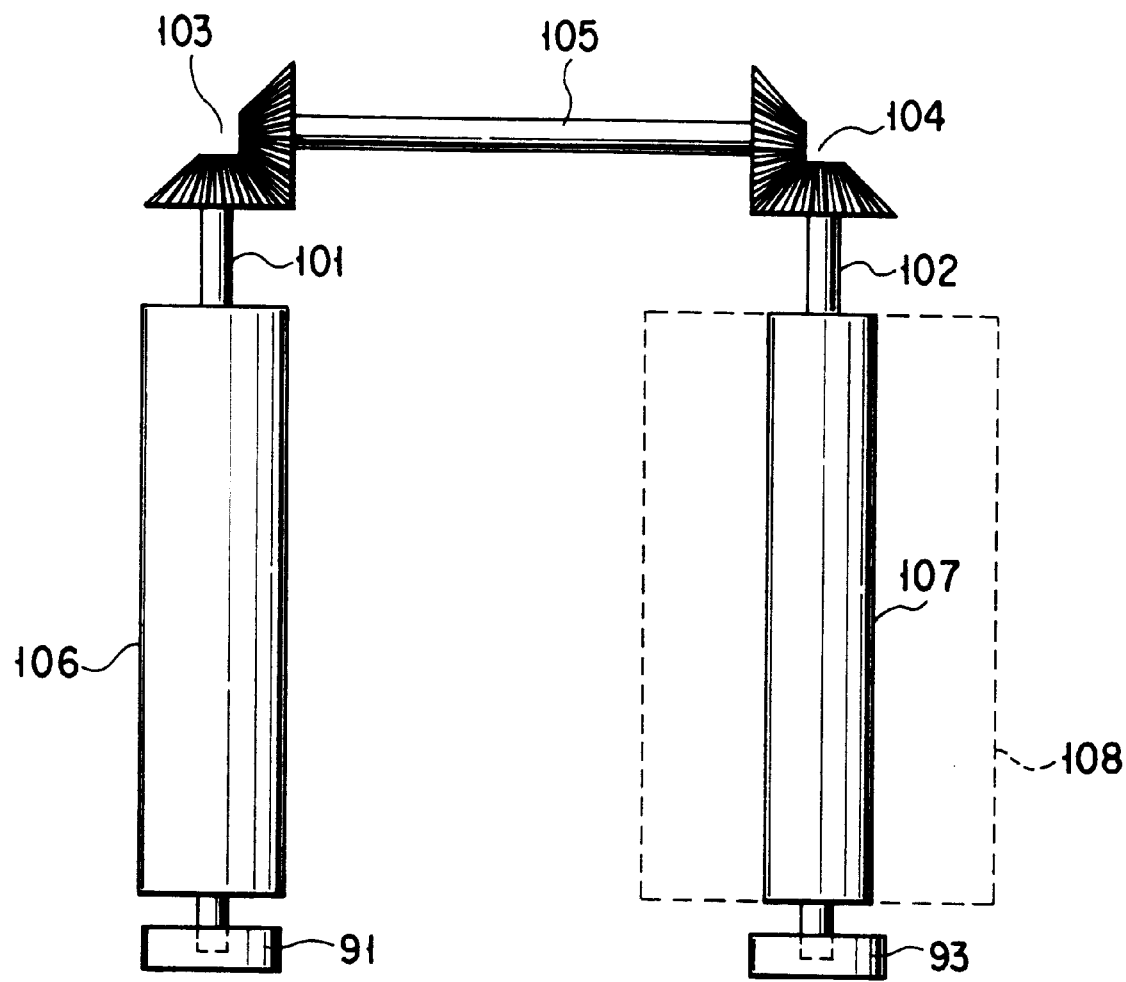
FIG. 14 is a plan view schematically showing the gist portion of an apparatus according to said still another embodiment of the present invention.

Additional modifications are shown in FIGS. 12 to 14. In the modification shown in FIG. 12, the second suction duct 82 is formed to have a large suction port 82A, making it possible to suck the dissolved resist and excess solvent over a large area in the peripheral portion on the back surface of the substrate. In this case, the solvent discharged from the solvent discharge section 75 is prevented from dripping onto the floor so as to have the treating atmosphere adversely affected by the solvent vapor.

FIG. 13 shows a structure adapted for controlling the flow rate of the discharged solvent while changing the angle of the solvent discharge section. To be more specific, a solvent discharge section 91 having a slit-like discharge port is rotatably mounted to the surrounding member 37. Also, a solvent supply unit 92 is arranged apart from the surrounding member 37. In this modification, a solvent is supplied from the solvent supply unit 92 into the solvent discharge section 91 through a tube 91a. The solvent supply unit 92 comprises a header 94 and a solvent flow rate control section 95. These header 94 and the solvent flow rate control section 95 are substantially equal in construction to the header and the solvent discharge section included in the apparatus of the other embodiments described previously. In the modification shown in FIG. 13, a rod 93 included in the solvent flow rate control section 95 is rotated in synchronism with the solvent discharge section 91. It is desirable to arrange a receptacle 97 connected to a discharge line 96 for removing the waste liquid and waste gas below the flow rate control section 95 in view of the dripping of the solvent which is caused by the rotation of the control section 95.

Further, FIG. 14 shows a structure which permits a rod 107 and a solvent discharge section 106 to be rotated in synchronism. Specifically, shafts 101 and 102 of the solvent discharge section 106 and the rod 107 are joined to each other by a transmission shaft 105 via bevel gear mechanisms 103 and 104, respectively.

As described above, a solvent discharge section large enough to cover entirely one side of a rectangular substrate is used in the present invention for dissolving and removing an undesired thin film from a peripheral portion of the substrate. What should be noted is that the particular construction of the present invention permits sucking and discharging the dissolved resist and excess solvent efficiently with a small sucking capability.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An apparatus for removing a coated film from a peripheral portion of a substrate, comprising:
   a substrate holding section for holding a rectangular substrate substantially horizontal such that a film-coated surface of said substrate faces upward;
   a surrounding member for surrounding a peripheral portion of the substrate held by said substrate holding section;

a solvent discharge section mounted to face an upper peripheral portion of the substrate held by said substrate holding section, rotatable about its longitudinal axis, and having a solvent discharge port substantially equal in length to one side of the rectangular substrate;

a solvent supply mechanism for supplying a solvent capable of dissolving said coated film into said solvent discharge section;

a solvent discharge rate control mechanism for controlling the discharge rate of the solvent from said solvent discharge section;

a rotating mechanism for rotating the solvent discharge section about its longitudinal axis between a first position in which said solvent discharge port faces perpendicularly downward the front surface of the substrate and a second position in which the solvent discharge port obliquely faces a peripheral portion on the front surface of the substrate;

a suction discharge mechanism including a suction discharge passageway for discharging by suction the coated film dissolved in the solvent and the solvent itself; and control means for controlling the operation of each of the solvent discharge rate control mechanism and the rotating mechanism;

wherein said control means controls the rotating mechanism, while allowing the solvent to be discharged from the solvent discharge port, to be rotated from the first position to said second position and also controls the solvent discharge rate control mechanism to permit the solvent to be discharged from the solvent discharge port in a larger amount when the solvent discharge port is in the second position than in the first position.

2. The apparatus according to claim 1, wherein said solvent discharge section comprises a rod having a slit communicating with said solvent discharge port formed therein, and said solvent discharge rate control mechanism includes a casing holding said rod such that the rod is rotatable about its longitudinal axis, a hole having at least a small width portion and a large width portion being formed through the wall of said casing; when the rod is rotated within the casing to bring the solvent discharge port to the first position, said slit communicates with said small width portion of the hole to permit the solvent to be discharged in a low discharge rate from the solvent discharge section; and when the rod is rotated within the casing to bring the solvent discharge port to the second position, said slit communicates with said large width portion of the hole to permit the solvent to be discharged in a high discharge rate from the solvent discharge section.

3. The apparatus according to claim 1, wherein said solvent discharge port is longer than the longer side of said rectangular substrate.

4. The apparatus according to claim 1, further comprising a moving mechanism for moving said solvent discharge section along the front surface of the substrate in a direction perpendicular to the longitudinal direction of the solvent discharge section.

5. The apparatus according to claim 1, further comprising a header including a liquid reservoir into which a solvent is supplied from said solvent supply mechanism, said header being arranged above the solvent discharge section and said liquid reservoir being capable of communication with the solvent discharge port of the solvent discharge section.

6. The apparatus according to claim 1, further comprising a moving mechanism for moving said suction discharge means to permit the suction discharge port to be moved toward or away from a peripheral portion of the substrate.

7. The apparatus according to claim 1, further comprising a second solvent discharge section for spraying a solvent against a peripheral portion on a back surface of the substrate.

8. The apparatus according to claim 1, further comprising second suction discharge means for sucking and discharging the material dissolved by the solvent and removed from a peripheral portion on the back surface of the substrate.

9. The apparatus according to claim 5, wherein said slit extends through said rod in a radial direction of the rod, one open end of the slit communicating with said liquid reservoir and the other open end communicating with the free space within said surrounding member.

10. The apparatus according to claim 4, wherein said control means controls said moving mechanism, while the solvent discharge port is being rotated by the rotating mechanism from the first position to the second position, to permit the solvent discharge section to be moved along the front surface of the substrate in a direction perpendicular to the longitudinal direction of the solvent discharge section.

11. The apparatus according to claim 5, wherein said solvent supply mechanism includes pressurizing means for supplying a pressurized gas into the liquid reservoir of the header.

12. The apparatus according to claim 1, wherein said substrate holding section consists of a spin chuck for holding and rotating the substrate.

13. The apparatus according to claim 1, wherein said substrate is a glass substrate for an LCD device, said coating film is a photoresist film, and said solvent is a thinner.

14. The apparatus according to claim 1, wherein said suction discharge port is formed in said surrounding member.

* * * * *